United States Patent
Verhaar et al.

(10) Patent No.: US 6,518,619 B2
(45) Date of Patent: Feb. 11, 2003

(54) VIRTUAL-GROUND, SPLIT-GATE FLASH MEMORY CELL ARRANGEMENTS AND METHOD FOR PRODUCING SAME

(75) Inventors: Robertus Dominicus Joseph Verhaar, Eindhoven (NL); Guido Jozef Maria Dormans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/741,667

(22) Filed: Dec. 19, 2000

(65) Prior Publication Data
US 2001/0030341 A1 Oct. 18, 2001

(30) Foreign Application Priority Data
Dec. 21, 1999 (EP) .............................. 99204451

(51) Int. Cl.[7] ............................................ H01L 29/788
(52) U.S. Cl. ................. 257/316; 257/321; 257/900; 365/185.01
(58) Field of Search ................. 257/316, 321, 257/900; 365/185.01, 185.18, 185.28

(56) References Cited

U.S. PATENT DOCUMENTS

| | | | |
|---|---|---|---|
| 5,268,585 A | 12/1993 | Yamauchi | 257/316 |
| 5,338,952 A | 8/1994 | Yamauchi | 257/315 |
| 5,414,286 A | 5/1995 | Yamauchi | 257/315 |
| 5,422,504 A | 6/1995 | Chang et al. | 257/316 |
| 5,587,332 A | 12/1996 | Chang et al. | 437/43 |
| 5,614,747 A | 3/1997 | Ahn et al. | 257/316 |

FOREIGN PATENT DOCUMENTS

| | | |
|---|---|---|
| JP | 07130884 A | 5/1995 |
| WO | 9913513 A1 | 3/1999 |

*Primary Examiner*—Mark V. Prenty
(74) *Attorney, Agent, or Firm*—Aaron Waxler

(57) ABSTRACT

A memory cell including:
(a) a semiconductor substrate (1) provided with first and second diffusion layers (8);
(b) a floating gate (11) on a floating gate insulating film (9);
(c) a selection gate (4) on a selection gate insulating film (2);
(d) a control gate (13) on a control gate insulating film (12);
(e) the first and second diffusion layers (8) being arranged as the source and the drain of a field effect transistor structure, and the floating gate (11), selection gate (4) and control gate (13) being arranged as series field effect gates in the field effect transistor structure.

5 Claims, 3 Drawing Sheets

VIRTUAL-GROUND, SPLIT-GATE FLASH MEMORY CELL ARRANGEMENTS AND METHOD FOR PRODUCING SAME

BACKGROUND OF THE INVENTION

The present invention is in the field of flash memory cells provided with split-gates and having a virtual ground arrangement.

Several patents have proposed to use split-gate arrangements in flash memory cells, e.g., U.S. Pat. No. 5,268,585, U.S. Pat. No. 5,338,952, U.S. Pat. No. 5,414,286, U.S. Pat. No. 5,587,332, U.S. Pat. No. 5,614,747, WO/99/13513, and JP-A-07/130884. Of these prior art documents, U.S. Pat. No. 5,338,952 also discloses a virtual-ground arrangement of such split-gate memory cells. This known virtual ground arrangement will be summarized below.

FIG. 1, which corresponds to FIG. 7 of U.S. Pat. No. 5,338,952, shows two split-gate memory cells C11, C12 in a virtual ground arrangement. Memory cells C11, C12 are built on a p-type Si substrate 1. Three $n^+$ diffusion layers 8 are shown. The left-hand $n^+$ layer 8 operates as a drain to memory cell C11. The middle diffusion layer 8 operates as a source to memory cell C11 and as a drain to memory cell C12. The right-hand diffusion layer 8 operates as a source to memory cell C12 (and may operate as a drain to a further memory cell, not shown, at the right-hand side of memory cell C12). Since adjacent memory cells share a source/drain diffusion layer, this arrangement is referred to as "virtual ground".

A first $SiO_2$ gate oxide film 2 is present on the substrate 1 between a selection gate 4 and the substrate 1. A rather thick second insulating layer 5 of $SiO_2$ is located on top of the selection gate 4. A floating gate 11 is located adjacent to the selection gate 4, and separated from the substrate 1 by a tunnel oxide film 9 made of $SiO_2$. The floating gate 11 is surrounded by an insulating film to insulate the floating gate from any other conducting element.

On top of the entire structure, as shown in FIG. 1, a control gate 13 is formed.

FIG. 2, which corresponds to FIG. 6 of U.S. Pat. No. 5,338,952, shows an equivalent electric circuit of four memory cells C11, C12, C21, C22 in a virtual ground connection scheme. In FIG. 2, the following reference signs are used. Reference sign CG1 refers to a control gate line interconnecting control gates 13 of memory cells C11, C12 as shown in FIG. 1. Reference sign CG2 refers to a control gate line interconnecting control gates of memory cells C21, C22. Reference signs SG1 and SG2 refer to selection gate lines interconnecting selection gates of memory cells C11, C21, and C12, C22, respectively. Reference sign BL1 refers to a bit line interconnecting the drains of memory cells C11, C21. Reference sign BL2 refers to a bit line interconnecting both the sources of memory cells C11, C21 and the drains of memory cells C12, C22. Reference sign BL3 refers to a bit line interconnecting the sources of memory cells C12, C22.

For programming, erasing, and reading e.g. memory cell C21, the following voltages on the control gate lines CG1, CG2, the selection gate lines SG1, SG2, and the bit lines BL1, BL2, BL3 apply (Table 1).

TABLE 1

Write, erase, and read voltages for memory arrangement of FIG. 2

|  | BL1 | BL2 | BL3 | CG1 | CG2 | SG1 | SG2 |
| --- | --- | --- | --- | --- | --- | --- | --- |
| writing | +5 V | 0 V | 0 V | 0 V | +12 V | +2 V | 0 V |
| erasing | +5 V | +5 V | 0 V | −11 V | −11 V | 0 V | 0 V |
| reading | +2 V | 0 V | 0 V | 0 V | +5 V | +5 V | 0 V |

Writing information into memory cells is carried out by means of the "Source Side Injection" (SSI) current mechanism. Erasing memory cells is done by "Folwer-Nordhein" (FN) tunneling.

As already referred to in U.S. Pat. No. 5,338,952, a problem during reading memory cell C21 may arise due to over-erasure of memory cell C11. Over-erasure of memory cell C11 may occur during erasing cell C11 and refers to too large an amount of electrons being removed from the floating gate 11 such that, after the erasing procedure, floating gate 11 is effectively positively charged. Consequently, even though control gate line CG1 is not charged during reading memory cell 21, memory cell C11 may still be slightly conducting since its selection gate 4 is also positively charged owing to selection line SG1 being high. Thus, since bit line BL1 is high and bit line BL2 is low during reading memory cell C21, an undesired leakage current may flow through memory cell C11.

In order to solve this problem of over-erasure, U.S. Pat. No. 5,338,952 proposes to provide the individual memory cells with drain and source lines extending perpendicularly to one another, so that by generating suitable drain and source voltages only one desired memory cell will be selected.

SUMMARY OF THE INVENTION

Therefore, it is an object of the present invention to provide a split-gate memory cell that solves the problem of over-erasure and that can be connected in a virtual ground arrangement in which source and drain lines are still parallel to one another.

This object is obtained by means of a memory cell according to the invention, comprising:
(a) a semiconductor substrate provided with a first diffusion layer and a second diffusion layer on a substrate surface;
(b) a floating gate insulating film on the substrate surface and a floating gate on the floating gate insulating film;
(c) a selection gate insulating film on the substrate surface and a selection gate on the selection gate insulating film;
(d) a control gate insulating film on the substrate surface and a control gate on the control gate insulating film;
the floating gate, selection gate and control gate being electrically insulated from one another, the first and second diffusion layers being arranged as a source and a drain of a field effect transistor structure, and the floating gate and selection gate being arranged as series field effect gates in the field effect transistor structure, and the control gate being arranged as a further field effect gate in the field effect transistor structure, in series with both the floating gate and the selection gate.

It is observed that, in this definition, "in series" refers to the different gates being arranged such that they are able to generate conducting channels in series with one another between the drain and the source of the memory cell transistor structure.

Such a memory cell may be termed a "three transistor flash memory cell" or a "double-split-gate flash memory cell". The advantage of such a memory cell is that no conducting channel can be inadvertently generated between source and drain diffusion layers by an over-erased floating gate. It will always be necessary that the control gate voltage is also high enough to provide a conducting channel in the substrate below the control gate in series with the conducting channel in the substrate due to the selection gate voltage.

Advantageously, a plurality of such memory cells can be applied in a memory, wherein:

the memory cells are arranged in a plurality of rows and a plurality of columns, the rows extending in a row direction and the columns extending in a column direction;

the first diffusion layer extends in the column direction to form interconnected, combined sources and drains of adjacent columns of memory cells in the column direction;

the second diffusion layer extends in the column direction to form interconnected, combined sources and drains of adjacent columns of memory cells in the column direction;

selection gates of memory cells in a column of memory cells are interconnected by a selection gate line extending in the column direction;

control gates of memory cells in a row direction are interconnected by a control gate line extending in the row direction.

In such a memory, the sources of a column of memory cells are the drains of the memory cells of an adjacent column. Thus, the memory has a virtual ground structure. Moreover, the control gate line extends in a direction perpendicular to the source and drain lines, thus providing a unique selection of any memory cell during reading and avoiding that a conducting channel can be inadvertently generated between source and drain diffusion layers by an over-erased floating gate. For each individual memory cell, it will always be necessary that the control gate voltage is also high enough to provide a conducting channel in the substrate below the control gate in series with the conducting channel in the substrate due to the selection gate voltage.

The present invention also relates to a process for making a memory cell comprising the following steps:

(a) providing a semiconductor substrate of a first conductivity type;
(b) forming a selection gate insulating layer on the substrate;
(c) forming a first conducting layer on the selection gate insulating layer;
(d) forming an additional insulating layer on the first conducting layer;
(e) etching the additional insulating layer, the first conducting layer and the selection gate insulating layer to form a selection gate separated from the substrate by a selection gate insulating film and having an additional insulating film on top of it;
(f) forming a floating gate insulating layer;
(g) forming side wall spacers adjacent to the selection gate and separated from the selection gate by the floating gate insulating layer;
(h) providing first and second diffusion layers of a second conductivity type in the substrate using the side wall spacers and the additional insulating film as a diffusion mask;
(i) etching a portion of the side wall spacers at one side of the selection gate to form a floating gate from a remaining portion of the side wall spacer at an opposite side of the selection gate;
(j) forming a control gate insulating layer;
(k) forming a control gate on said control gate insulating layer.

This process is a simple alternative to the process proposed in FIGS. 3A–3E in U.S. Pat. No. 5,614,747. Instead of first removing side wall spacers at one side of the selection gate and then providing the substrate with diffusion layers, the process according to the invention exchanges these two steps such that a portion of the control gate will also form the gate of a field effect transistor structure in series with the field effect transistors formed by the floating gate and the selection gate.

In a similar way, the present invention also provides a method for making a memory provided with memory cells, the memory cells being arranged in a plurality of rows and a plurality of columns, the rows extending in a row direction and the columns extending in a column direction; the method comprising the following steps:

(a) providing a semiconductor substrate of a first conductivity type;
(b) forming a selection gate insulating layer on the substrate;
(c) forming a first conducting layer on the selection gate insulating layer;
(d) forming an additional insulating layer on the first conducting layer;
(e) etching the additional insulating layer, the first conducting layer and the selection gate insulating layer to form selection gates separated from the substrate by selection gate insulating films and having additional insulating films on top of them;
(f) forming a floating gate insulating layer;
(g) forming side wall spacers adjacent to the selection gates and separated from the selection gates by the floating gate insulating layer;
(h) providing diffusion layers of a second conductivity type in the substrate using the side wall spacers and the additional insulating films as a diffusion mask;
(i) etching portions of the side wall spacers at first sides of the selection gates to form floating gates from remaining portions of the side wall spacers at second sides opposite the first sides of the selection gates;
(j) forming a control gate insulating layer;
(k) forming a control gate layer on the control gate insulating layer;
(l) forming control gates in the control gate layer.

The memory cell according to the invention can advantageously be both programmed and deprogrammed via a Folwer-Nordhein tunneling process. To that end, the invention also relates to a method of either programming or deprogramming a memory cell, the memory cell comprising:

(a) a semiconductor substrate provided with a first diffusion layer and a second diffusion layer on a substrate surface;
(b) a floating gate insulating film on the substrate surface and a floating gate on the floating gate insulating film;
(c) a selection gate insulating film on the substrate surface and a selection gate on the selection gate insulating film;
(d) a control gate insulating film on the substrate surface and a control gate on the control gate insulating film;

the floating gate, selection gate and control gate being electrically insulated from one another, the first and second diffusion layers being arranged as a source and a drain of a field effect transistor structure, the floating gate and selection gate being arranged as series field effect gates in the field effect transistor structure, and the control gate being arranged as a further field effect gate in the field effect transistor structure, in series with both the floating gate and the selection gate, and the method comprising the following step:

applying predetermined voltages to the control gate, the selection gate and the first and second diffusion layers, such that the floating gate is either charged or discharged by Folwer-Nordhein tunneling.

During reading a memory cell, the cell is uniquely addressed by the control gate, thus avoiding over-erasure problems. To that end, the invention also relates to a method of reading a memory cell, the memory cell comprising:
(a) a semiconductor substrate provided with a first diffusion layer and a second diffusion layer on a substrate surface;
(b) a floating gate insulating film on the substrate surface and a floating gate on the floating gate insulating film;
(c) a selection gate insulating film on the substrate surface and a selection gate on the selection gate insulating film;
(d) a control gate insulating film on the substrate surface and a control gate on the control gate insulating film;
the floating gate, selection gate and control gate being electrically insulated from one another, the first and second diffusion layers being arranged as a source and a drain of a field effect transistor structure, the floating gate and selection gate being arranged as series field effect gates in the field effect transistor structure, and the control gate being arranged as a further field effect gate in the field effect transistor structure, in series with both the floating gate and the selection gate, and the method comprising the following step:
applying predetermined voltages to the control gate, the selection gate and the first and second diffusion layers, such that conducting channels are formed in the substrate surface between the first and second diffusion layers and below both the control gate and the selection gate.

BRIEF DESCRIPTION OF THE DRAWING

The invention will be explained with reference to some drawings that are only intended to further illustrate the present invention and do not limit the scope of protection of the present invention. The scope of the invention is only limited by the annexed claims. In the drawings:

DESCRIPTION OF THE PREFERRED EMBODIMENTS

Figure 1:
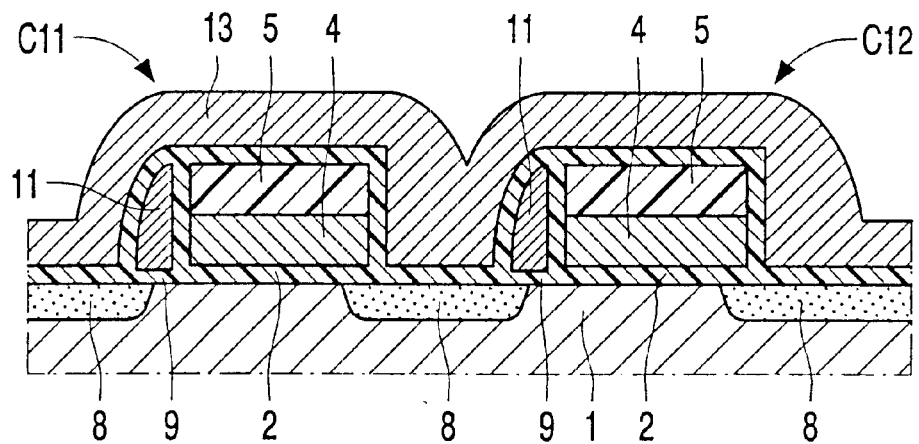
FIG. 1 shows two split-gate memory cells in a virtual ground arrangement in accordance with the prior art.
Figure 2:
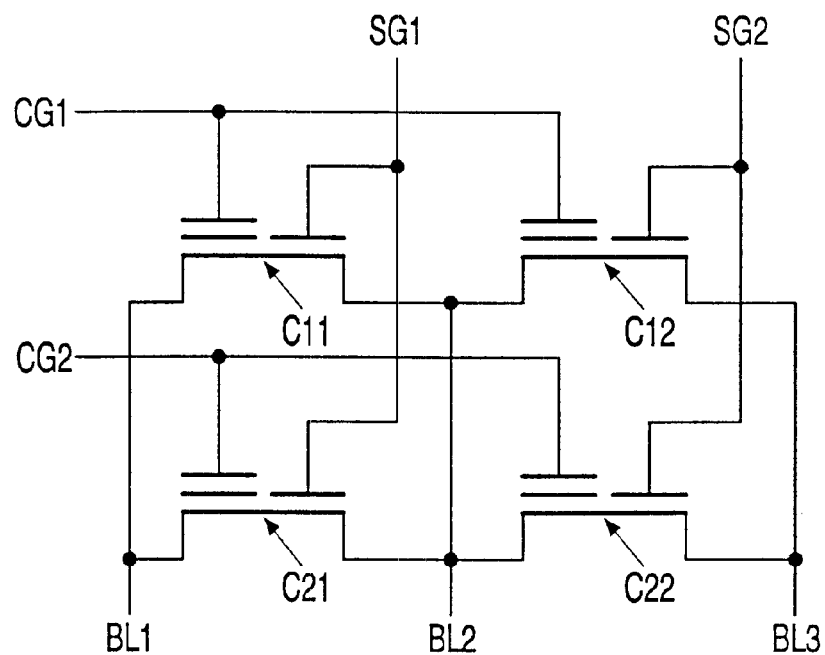
FIG. 2 shows a memory area with four split-gate memory cells connected in a virtual ground arrangement in accordance with the prior art.

FIGS. 1 and 2 have been described above.

Figure 3:
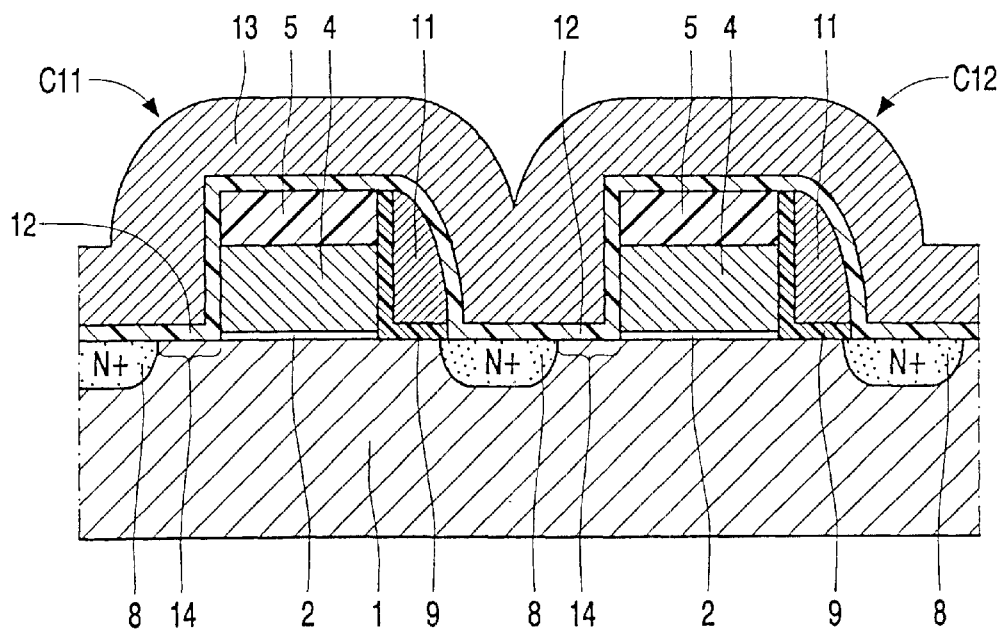
FIG. 3 shows two adjacent memory cells in cross section in accordance with the present invention.

FIG. 3 shows two adjacent memory cells in accordance with the present invention, connected in a virtual ground arrangement. The two memory cells are very similar to the two memory cells known from the prior art shown in FIG. 1. The same reference numberals refer to the same elements as in FIG. 1.

The main difference with respect to the prior art memory cells is that the diffusion layers 8 do not extend within the substrate 1 to a location below the side wall of the selection gates 4 of those memory cells for which they serve as sources. Instead, there is a predetermined distance along the substrate surface between the sources and the selection gates. Along this distance there is an area 14 at the surface of the substrate 1 where the control gate 13 may generate a conducting channel when it is supplied with a proper predetermined voltage. Thus, between two adjacent diffusion layers 8 there are three instead of two series field effect transistor channels: one in the area 14 controlled by the control gate voltage, one below the selection gate 4, and one below the floating gate 11.

Figure 4:
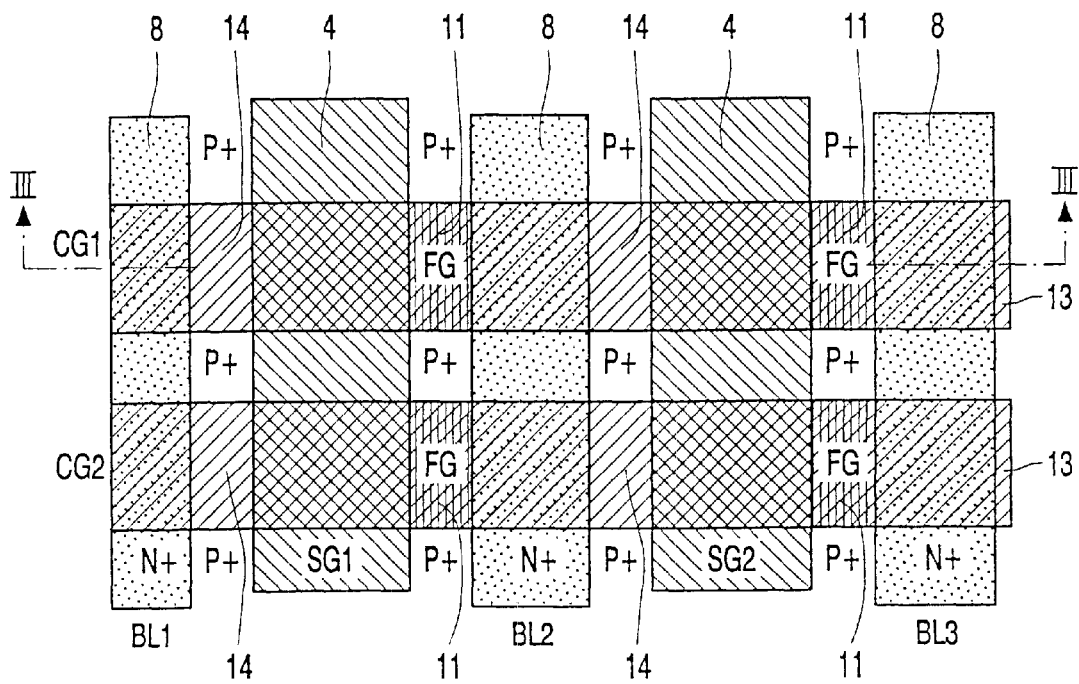
FIG. 4 shows a plan view of four memory cells arranged in an array.

FIG. 4 shows a top view of the arrangement of FIG. 3 for a four memory cell array. The sources/drains 8 of memory cells in a column are interconnected through single diffusion layers which form the bit lines BL1, BL2, BL3. The selection gates 4 of memory cells in a column are interconnected through polysilicon lines SG1, SG2. The control gates 13 of memory cells in a row are interconnected through control gate lines CG1, CG2. The control gate lines CG1, CG2 operate as word lines and extend in a direction perpendicular to the bit lines BL1, BL2, BL3, and to the selection gate lines SG1, SG2. Floating gates FG of the individual memory cells are, of course, not connected to any other conductive part of the memory cells.

Figure 5:
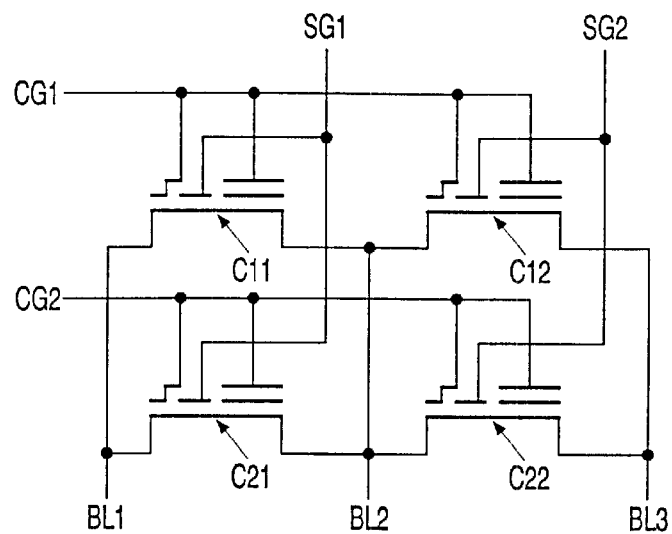
FIG. 5 shows an equivalent electric circuit of the four memory cells of FIG. 4.

The advantage of the inventive memory cell structure can best be explained with reference to FIG. 5. FIG. 5 shows the equivalent electric circuit of the memory arrangement of FIG. 4. As explained in the introduction above, one of the problems related to the prior art arrangement of FIGS. 1 and 2 is the possible occurrence of a leakage current, during reading which flows to non-addressed memory cells due to he problem of over-erasure. For instance, in FIG. 2, during reading memory cell C21 memory cell 11 may also conduct slightly even though only memory cell C21 is addressed. In the arrangement according to the invention this is impossible. During reading memory cell C21, the same voltages apply as in table 1 and, if the floating gate of C21 is not charged, a read current will flow through memory cell C21 since all three series field effect transistors in memory cell C21 will conduct. If the floating gate of memory cell C21 is negatively charged (programmed state) the field effect transistor controlled by the floating gate will not conduct and no read current will flow. Thus, the state of the memory cell, i.e., programmed or deprogrammed, can be read.

At the same time, memory cell C11 will never conduct. Its control gate will be kept at a low voltage since CG1=0V. Therefore, the field effect transistor controlled by the control gate in memory cell C11 will never conduct. Consequently, even if the floating gate of memory cell C11 would have been over-erased and generate a conducting channel in series with the conducting channel generated by the selection gate line SG1 being high no leakage current can flow between bit lines BL1 and BL2 through memory cell 11.

Figure 6A:
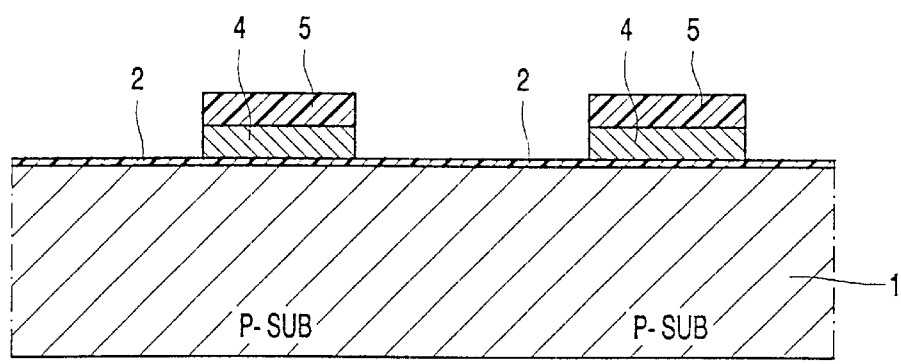
FIGS. 6a and 6b show two intermediate steps during the manufacture of memory cells.
Figure 6B:
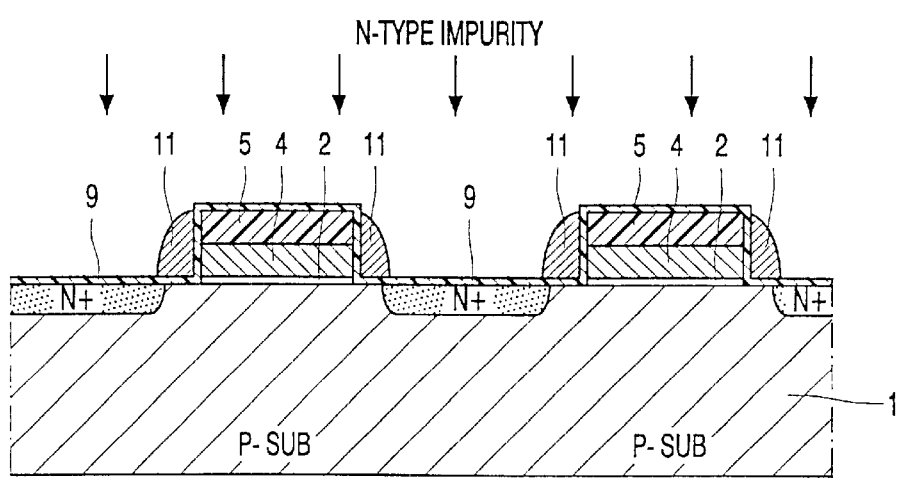

FIGS. 6a and 6b show two intermediate steps in the manufacture of an embodiment of memory cells in accordance with the invention. The following steps will be carried out.

On a semiconductor substrate 1 of a first conductivity type, preferably p-type, a thin insulating layer 2 is formed. This insulating layer will later become a gate oxide layer of a selection gate.

On the insulating layer 2, a first conducting polysilicon layer 4 is deposited. Next, a rather thick insulating layer 5 is deposited on the first polysilicon layer 4. Using known lithography techniques, the layers 4 and 5 are patterned to form a structure as shown in FIG. 6a. It is observed that, in the preferred embodiment, the layers 4 and 5 extend in a direction perpendicular to the surface of the drawing of FIG. 6a in order to later form selection gate lines SG1 and SG2 and an insulating layer on top of them.

Next, the thin insulating layer 2 is removed from the exposed substrate surface, and a new insulating layer 9 is deposited on the entire structure. This new insulating layer 9 will become a floating gate oxide layer.

Side wall spacers 11 are formed adjacent to the polysilicon layer 4 and separated from the polysilicon layer 4 by insulating layer 9. The side wall spacers may be formed by an anisotropic etching process as is known to persons skilled in the art.

Diffusion layers 8 of a second conductivity type, preferably n-type, are formed by means of an ion implantation process in said substrate (1) using the side wall spacers 11 as borders of a mask in a self-aligned process.

Next, portions of the side wall spacers 11 at one side of the polysilicon layers 4 are removed by etching. Thus, floating gates 11 are formed from remaining portions of said side wall spacers at opposite sides of the polysilicon layers 4.

If the exposed parts of the insulating layer 9 do not have a desired thickness, as is required for control gate field effect transistors, insulating layer 9 is removed. A new insulating layer 12 is formed. On top of the insulating layer 12, a polysilicon layer 13 is formed. The polysilicon layer 13 and the floating gates 11 are patterned to form the structure, as shown in FIGS. 3 and 4, with parallel control gate lines CG1, CG2, and individual floating gates 11.

The memory cells can be both programmed and deprogrammed by the Folwer-Nordhein tunneling mechanism. For instance, the voltages shown in table 2 may be used for writing, erasing and reading memory cell C21.

TABLE 2

Write, erase, and read voltages for memory arrangement of FIG. 5 using Folwer-Nordhein tunneling for writing and erasing; $V_{pp} = 6.5–8$ V

|  | BL1 | BL2 | BL3 | CG1 | CG2 | SG1 | SG2 | Substr. |
|---|---|---|---|---|---|---|---|---|
| writing | Float | $-V_{pp}$ | float | 0 V | $+V_{pp}$ | $-V_{pp}$ | $-V_{pp}$ | $-V_{pp}$ |
| erasing | $+V_{pp}$ | $+V_{pp}$ | $+V_{pp}$ | $-V_{pp}$ | $-V_{pp}$ | $+V_{pp}$ | $+V_{pp}$ | $+V_{pp}$ |
| reading | Gnd | 0.5 V | 0 V | 0 V | 0.9 V | 0.9 V | 0 V | 0 V |

Using the memory structure described hereinabove, the integration density can be enhanced significantly. In principle, every memory cell may occupy as little as $4F^2$ surface area, where F is the minimum dimension in the technology used, and equals, for instance, half the pitch distance between two adjacent polysilicon lines.

Although a preferred embodiment of the invention has been described, it will be evident to persons skilled in the art that many modifications can be made without departing from the scope of the invention. For instance, the order of the three field effect transistors controlled by the control gate, selection gate and floating gate, respectively, may differ from the one shown in the figures. Moreover, additional doping profiles may be applied if necessary to enhance the memory cell characteristics. Memory cells in adjacent columns may be mirror symmetrical with respect to bit lines. Then, a bit line may be a source line for two adjacent columns whereas the next bit line will be a drain line for two adjacent columns.

What is claimed is:

1. A memory cell comprising:
   (a) a semiconductor substrate (1) provided with a first diffusion layer (8) and a second diffusion layer (8) on a substrate surface;
   (b) a floating gate insulating film (9) on said substrate surface and a floating gate (11) on said floating gate insulating film (9);
   (c) a selection gate insulating firm (2) on said substrate surface and a selection gate (4) on said selection gate insulating firm (2);
   (d) a control gate insulating film (12) on said substrate surface and a control gate (13) on said control gate insulating firm (12);

said floating gate (11), selection gate (4) and control gate (13) being electrically insulated from one another, the first and second diffusion layers (8) being arranged as a source and a drain of a field effect transistor structure, and said floating gate (11) and selection gate (4) being arranged as series field effect gates in said field effect transistor structure, and said control gate (13) being arranged as a further field effect gate in said field effect transistor structure, in series with both said floating gate (11) and said selection gate (4), wherein said floating gate (11) is a side wall spacer on an insulating side wall of said selection gate (4).

2. A memory cell according to claim 1, wherein a first intermediate insulating film (5, 12) separates said selection gate (4) from said control gate (13), and a second intermediate insulating film (12) separates said floating gate (11) from said control gate (13), said first intermediate insulating film (5, 12) being substantially thicker than said second intermediate insulating film (12).

3. A memory comprising a plurality of memory cells, each memory cell being arranged in accordance with claims 1, wherein the memory cells are arranged in a plurality of rows and a plurality of columns, said rows extending in a row direction and said columns extending in a column direction;

the first diffusion layer (8) extends in said column direction to form interconnected, combined sources and drains of adjacent columns of memory cells in said column direction;

the second diffusion layer (8) extends in said column direction to form interconnected, combined sources and drains of adjacent columns of memory cells in said column direction;

selection gates (4) of memory cells in a column of memory cells are interconnected by a selection gate line (SG1; SG2; SG3) extending in said column direction;

control gates (13) of memory cells in a row direction are interconnected by a control gate line (CG1; CG2) extending in said row direction.

4. Method of either programming or deprogramming a memory cell, the memory comprising:
   (a) a semiconductor substrate (1) provided with a first diffusion layer (8) and a second diffusion layer (8) on a substrate surface;
   (b) a floating gate insulating film (9) on said substrate surface and a floating gate (11) on said floating gate insulating film (9);
   (c) a selection gate insulating firm (2) on said substrate surface and a selection gate (4) on said selection gate insulating firm (2);
   (d) a control gate insulating film (12) on said substrate surface and a control gate (13) on said control gate insulating firm (12);

said floating gate (11), selection gate (4) and control gate (13) being electrically insulated from one another, the first and second diffusion layers (8) being arranged as a source and a drain of a field effect transistor structure, and said floating gate (11) and selection gate (4) being arranged as series field effect gates in said field effect transistor structure, and said control gate (13) being arranged as a further field effect gate in said field effect transistor structure, in series with both said floating gate (11) and said selection gate (4), wherein said floating gate (11) is a side wall spacer on an insulating side wall of said selection gate (4), and said method comprising the step:

applying predetermined voltages to said control gate (13), said selection gate (4) and said first and second diffusion layers, such that said floating gate is either charged or discharged by Folwer-Nordhein tunneling.

5. Method of reading a memory cell, the memory cell comprising:

(a) a semiconductor substrate (1) provided with a first diffusion layer (8) and a second diffusion layer (8) on a substrate surface;

(b) a floating gate insulating film (9) on said substrate surface and a floating gate (11) on said floating gate insulating film (9);

(c) a selection gate insulating firm (2) on said substrate surface and a selection gate (4) on said selection gate insulating firm (2);

(d) a control gate insulating film (12) on said substrate surface and a control gate (13) on said control gate insulating firm (12);

said floating gate (11), selection gate (4) and control gate (13) being electrically insulated from one another, the first and second diffusion layers (8) being arranged as a source and a drain of a field effect transistor structure, and said floating gate (11) and selection gate (4) being arranged as series field effect gates in said field effect transistor structure, and said control gate (13) being arranged as a further field effect gate in said field effect transistor structure, in series with both said floating gate (11) and said selection gate (4), wherein said floating gate (11) is a side wall spacer on an insulating side wall of said selection gate (4), and said method comprising the following step:

applying predetermined voltages to said control gate (13), said selection gate (4) and said first and second diffusion layers, such that conducting channels are formed in said substrate surface between said first and second diffusion layers and below both said control gate (13) and said selection gate (4).

* * * * *